(12) United States Patent
Franken

(10) Patent No.: US 7,525,637 B2
(45) Date of Patent: Apr. 28, 2009

(54) ASSEMBLY

(75) Inventor: Dominicus Jacobus Petrus Adrianus Franken, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 12/073,127

(22) Filed: Feb. 29, 2008

(65) Prior Publication Data

US 2008/0158534 A1 Jul. 3, 2008

Related U.S. Application Data

(62) Division of application No. 10/968,467, filed on Oct. 20, 2004.

(30) Foreign Application Priority Data

Oct. 21, 2003 (EP) .................................. 03078325

(51) Int. Cl.
G03B 27/42 (2006.01)
G02B 26/08 (2006.01)
G02B 7/02 (2006.01)
G03B 27/54 (2006.01)

(52) U.S. Cl. ............................. 355/53; 359/223; 355/67

(58) Field of Classification Search .................. 355/66, 355/67, 53, 77; 357/223, 819, 727; 250/216
See application file for complete search history.

(56) References Cited

U.S. PATENT DOCUMENTS 6,147,818 A 11/2000 Hale et al.

| 2002/0145811 A1 | 10/2002 | Omura ........................ 359/727 |
| 2003/0197914 A1 | 10/2003 | Cox et al. |
| 2005/0134821 A1 | 6/2005 | Franken |

FOREIGN PATENT DOCUMENTS

| EP | 0964307 A2 | 12/1999 |
| JP | 05-215957 | 8/1993 |
| JP | 10-068902 | 3/1998 |
| JP | 2000-040651 A | 2/2000 |
| JP | 2003-158070 A | 5/2003 |
| JP | 2003-163160 | 6/2003 |
| WO | WO 03/081337 A2 | 10/2003 |
| WO | WO 03/081337 A3 | 10/2003 |

OTHER PUBLICATIONS

English Translation of Decision on Rejection dated Mar. 25, 2008 for Patent Application No. 2004-305357.
English translation of Japanese Official Action issued for Japanese Patent Application No. 2004-305357, dated Dec. 4, 2007.

*Primary Examiner*—Peter B Kim
(74) *Attorney, Agent, or Firm*—Sterne, Kessler, Goldstein & Fox P.L.L.C.

(57) ABSTRACT

An assembly includes a first element having a predetermined functionality that is to be positioned with respect to a second element. The elements are arranged in a spaced relationship on a support frame. The support frame is provided with an interface surface formed on or in the support frame for receiving the first element. The interface surface determines the position of the first element with respect to the second element, and is configured in accordance with the predetermined functionality so that the first element is positionable with respect to the second element with at least three degrees of freedom.

13 Claims, 4 Drawing Sheets

ASSEMBLY

CROSS-REFERENCE TO RELATED APPLICATIONS

This application is a divisional of U.S. patent application Ser. No. 10/968,467, filed Oct. 20, 2004, which claims the benefit of priority from European Patent Application No. 3078325.2, filed Oct. 21, 2003, the entire contents of both applications are incorporated herein by reference.

FIELD

The present invention relates to an assembly that includes a first element having a predetermined functionality that is to be positioned with respect to a second element. The present invention also relates to, although is not limited in this respect, a lithographic apparatus, and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

The present invention finds application, by way of example only, in a projection optics assembly, which is typically part of a lithographic apparatus. A projection optics assembly that includes a support frame is known. Conventionally, depending on the particular lithographic apparatus, the projection optics assembly includes a reference frame and a plurality of sensor frames that are mounted in the reference frame. The sensor frame is a frame adapted to support various components. Typically, the support frame supports a first element in a spaced relationship with respect to a second element. The first and second elements are positioned and fixed in a very stable manner. Conventionally, in order to position the elements with respect to each other, spacers are needed to provide an interface surface. The spacers are disposed in the support frame. The elements to be disposed in the frame have a predetermined functionality, which determines how they are to be orientated in the support frame. For example, a sensor element for sensing a position in a certain direction must be oriented in a particular way with respect to that direction. Conventionally, spacers are provided to position the element according to its particular functionality. Currently, each position sensor is provided with six spacers. Attaining accurate positioning after mounting of the mirror modules in the projection optics assembly is done through employing additional spacers. The dimensions of each spacer are individually determined in accordance with the desired spacing it performs, as governed by the function of the element. Each spacer is then individually manufactured, typically by grinding the spacer material (which is for example, the material ZERODUR®) to the precise dimensions. Typically, several tens of spacers are required in order to fixedly position the elements with respect to one another on the support frame.

It has been found that in conventional projection optics assemblies, the use of spacers presents certain problems. The greater the number of spacers required, the greater the problems. In particular, a large number of spacers are needed to mount a sensing element that senses the position of an optical element, such as a mirror. One problem is that the use of spacers is expensive. In particular, the number of man hours required to determine the dimensions and to grind the spacers to size, and also to mount the spacers in the support frame is large. Furthermore, the large number of parts adds to the complexity of the resulting projection optics assembly, which may lead to long term stability issues regarding the positioning of the elements with respect to one another.

SUMMARY

It will be understood that problems arising in a particular application are discussed above, however the present invention has applications other than the particular example mentioned above with respect to conventional assemblies. In particular, the present invention has application where one element is positioned with respect to a second element.

It is an aspect of the present invention to overcome the problems identified with respect to conventional assemblies, such as projection optics assemblies. In particular, it is an aspect of the present invention to provide an adjustable mounting environment for the elements that is stable, and in which the number of spacers that is required is reduced.

According to an aspect of the invention, there is provided a lithographic apparatus that includes an illumination system for providing a beam of radiation, and a support structure for supporting a patterning device. The patterning device serves to impart the beam of radiation with a pattern in its cross-section. The apparatus also includes a substrate table for holding a substrate, and a projection optics assembly for projecting the patterned beam onto a target portion of the substrate. The projection optics assembly includes a first element having a predetermined functionality that is positioned with respect to a second element in a spaced relationship on a support frame. The support frame has an interface surface formed on or in the support frame for receiving the first element. The interface surface determines the position of the first element with respect to the second element, and is configured in accordance with the predetermined functionality so that the first element is positionable with respect to the second element with at least three degrees of freedom.

By providing the interface surface in or on the support frame, rather than having spacers define the interface surface, the spacers are rendered redundant. Thus, the manufacturability of the projection optics assembly may be simplified. In particular, the design and interface complexity may be reduced. Further, due to the fact that the number of different parts is decreased, individual tolerancing may be relaxed. In particular, the time saved to provide the redundant spacers may result in a decrease in production lead time. Also, the long term position stability may be improved, due to less parts and less interface surfaces.

In an embodiment, the first element is mounted directly on the interface surface. By mounting the first element directly on the interface surface, the manufacturability may be further improved.

In an embodiment, an interfacing element is disposed between the interface surface and the first element. By providing an interfacing element between the interface surface and the first element, the number of degrees of freedom that can be stably controlled may be increased to four.

In an embodiment, the interfacing element is disposed on the interface surface. By providing an interfacing element on the interface surface, the number of degrees of freedom that can be stably controlled is increased to six.

In an embodiment, the interfacing element is adapted to be attached to the interface surface by an attachment element or elements, which are adapted to constrain movement of the interfacing element with respect to at least one of the degrees of freedom. By providing attachment element(s), the elements may be held in the long term in a stable position with respect to one another.

According to a further aspect of the present invention, there is provided a method of assembling a projection optics assembly for a lithographic apparatus. The method includes forming an interface surface on or in a support frame for supporting a first element and a second element. The first element has a predetermined functionality. The method also includes positioning the first element on the interface surface, and positioning the second element on the support frame in spaced relationship to the first element. The interface surface is configured in accordance with the predetermined functionality so that the first element is positionable with respect to the second element with at least three degrees of freedom.

According to a further aspect of the present invention, there is provided a device manufacturing method that includes providing a substrate, providing a projection beam of radiation using an illumination system, using a patterning device to impart the projection beam with a pattern in its cross-section, and projecting the patterned beam of radiation onto a target portion of the substrate using a projection optics assembly. The assembly includes a first element having a predetermined functionality that is to be fixedly positioned with respect to a second element. The elements are arranged in a spaced relationship on a support frame. The support frame is provided with an interface surface formed on or in the support frame for receiving the first element. The interface surface determines the position of the first element with respect to the second element, and is adapted in accordance with the predetermined functionality of the first element so that the first element is positionable with respect to the second element with at least three degrees of freedom.

According to another aspect of the present invention, there is provided a device manufacturing method that includes patterning a beam of radiation, and projecting the patterned beam of radiation onto a target portion of a substrate using a projection optics assembly. The assembly includes a first element having a predetermined functionality that is positioned with respect to a second element. The elements are arranged in a spaced relationship on a support frame. The support frame has an interface surface formed on or in the support frame for receiving the first element. The interface surface determines the position of the first element with respect to the second element, and is configured in accordance with the predetermined functionality so that the first element is positionable with respect to the second element with at least three degrees of freedom.

According to a further aspect of the present invention, there is provided an assembly that includes a first element having a predetermined functionality that is to be positioned with respect to a second element. The elements are arranged in a spaced relationship on a support frame. The support frame is provided with an interface surface formed on or in the support frame for receiving the first element. The interface surface determines the position of the first element with respect to the second element, and is configured in accordance with the predetermined functionality so that the first element is positionable with respect to the second element with at least three degrees of freedom.

By providing the interface surface in or on the support frame, rather than spacers to define the interface surface, those spacers are rendered redundant. Thus, the manufacturability of the assembly may be simplified. In particular, the design and interface complexity may be reduced. Further, due to the fact that the number of different parts is decreased, individual tolerancing may be relaxed. In particular, the time saved to provide the redundant spacers may result in a decrease in production lead time. Also, the long term position stability may be improved, due to less parts and less interface surfaces.

According to a further aspect of the present invention, a lithographic apparatus is provided that includes an illumination system for providing a beam of radiation, and a support structure for supporting a patterning device. The patterning device serves to impart the beam of radiation with a pattern in its cross-section. The apparatus also includes a substrate table for holding a substrate, and a projection optics assembly for projecting the patterned beam onto a target portion of the substrate. The assembly includes a mirror and a sensor for measuring a position and/or orientation of the mirror. The mirror and the sensor are arranged in a spaced relationship on a support frame. The support frame has an interface surface formed on or in the support frame for receiving the sensor. The interface surface determines the position of the sensor with respect to the mirror, and is configured so that the sensor is positionable with respect to the mirror with at least three degrees of freedom.

According to an aspect of the present invention, there is provided an assembly that includes a mirror, a sensor unit constructed and arranged to sense a position and/or orientation of the mirror, and a support frame constructed and arranged to support the sensor unit. The support frame includes an interface surface. The assembly also includes an adjusting structure that is part of or engages the interface surface to adjust a position of the sensor unit based upon a known position of the interface surface and the mirror.

According to an aspect of the present invention, there is provided, in combination, a sensor unit and a mirror. The sensor unit is constructed and arranged to sense a position and/or orientation of the mirror. The sensor unit and mirror are disposed in spaced relationship on a support frame. The support frame has an interface surface. The interface surface receives the sensor unit. The interface surface corresponds to the position of the sensor unit with respect to the mirror and is configured so that the sensor unit is positionable with respect to the mirror with at least three degrees of freedom.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" as used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" as used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well-known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" as used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2b depicts details of one of the embodiments shown in FIG. 2a; and

DETAILED DESCRIPTION

Figure 1:
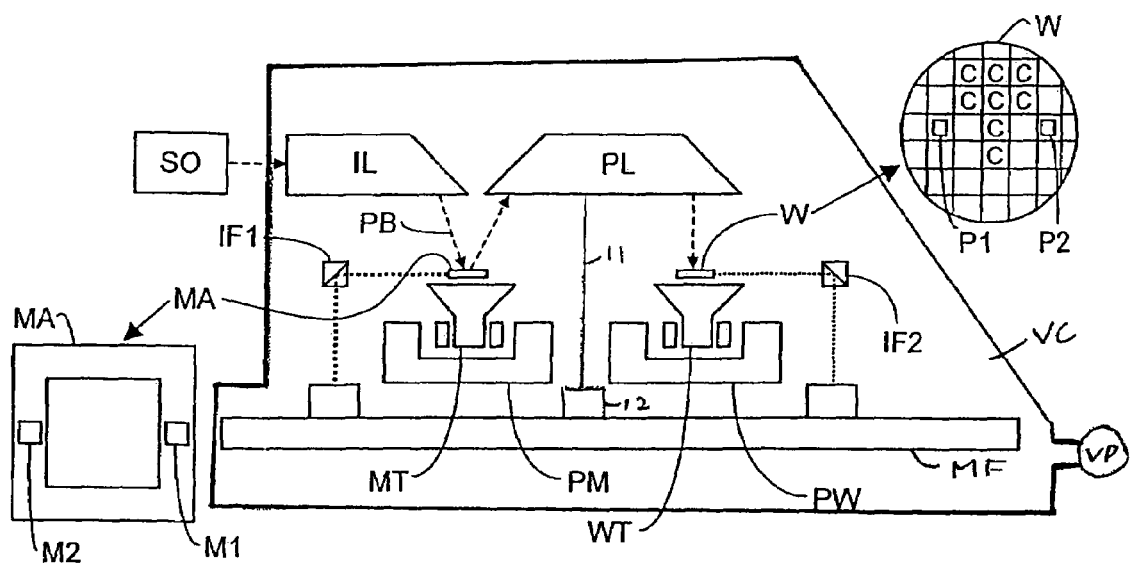
FIG. 1 depicts a lithographic apparatus according to an embodiment of the invention.

FIG. 1 schematically depicts a lithographic apparatus according to a particular embodiment of the invention. The apparatus includes: an illumination system (illuminator) IL for providing a projection beam PB of radiation (e.g. UV or EUV radiation); a first support structure (e.g. a mask table) MT for supporting a patterning device (e.g. a mask) MA and connected to a first positioning device PM for accurately positioning the patterning device with respect to item PL; a substrate table (e.g. a wafer table) WT for holding a substrate (e.g. a resist-coated wafer) W and connected to a second positioning device PW for accurately positioning the substrate with respect to item PL; and a projection system (e.g. a reflective projection lens) PL for imaging a pattern imparted to the projection beam PB by the patterning device MA onto a target portion C (e.g. including one or more dies) of the substrate W. The term "table" as used herein can also be considered or termed as a "support." It should be understood that the term support or table broadly refers to a structure that supports, holds, or carries a patterning device, mask, or substrate.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example, when the source is a plasma discharge source. In such cases, the source is not considered to form part of the lithographic apparatus and the radiation beam is generally passed from the source SO to the illuminator IL with the aid of a radiation collector including, for example, suitable collecting mirrors and/or a spectral purity filter. In other cases, the source may be integral part of the apparatus, for example when the source is a mercury lamp. The source SO and the illuminator IL, may be referred to as a radiation system.

The illuminator IL may include an adjusting device for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus may be used in the following modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

The lithographic apparatus of the example shown in FIG. 1 includes a vacuum chamber VC that is evacuated by vacuum pump VP. The beam PB impinges on mask MA and subsequently onto the target area of the substrate W in the vacuum chamber VC.

A so-called "metrology frame" MF provides an isolated frame of reference, which is mechanically isolated from the main apparatus frame. The metrology frame may be realized, for example, as a heavy table supported by airmounts (not shown) that provide a resilient support with a low elastic coefficient. The metrology frame MF supports sensitive components such as the interferometer IF and other position sensors and isolate them from vibration. Projection optics assembly PL is supported on metrology frame MF via a resilient element 12 and a support 11.

Figure 2A:
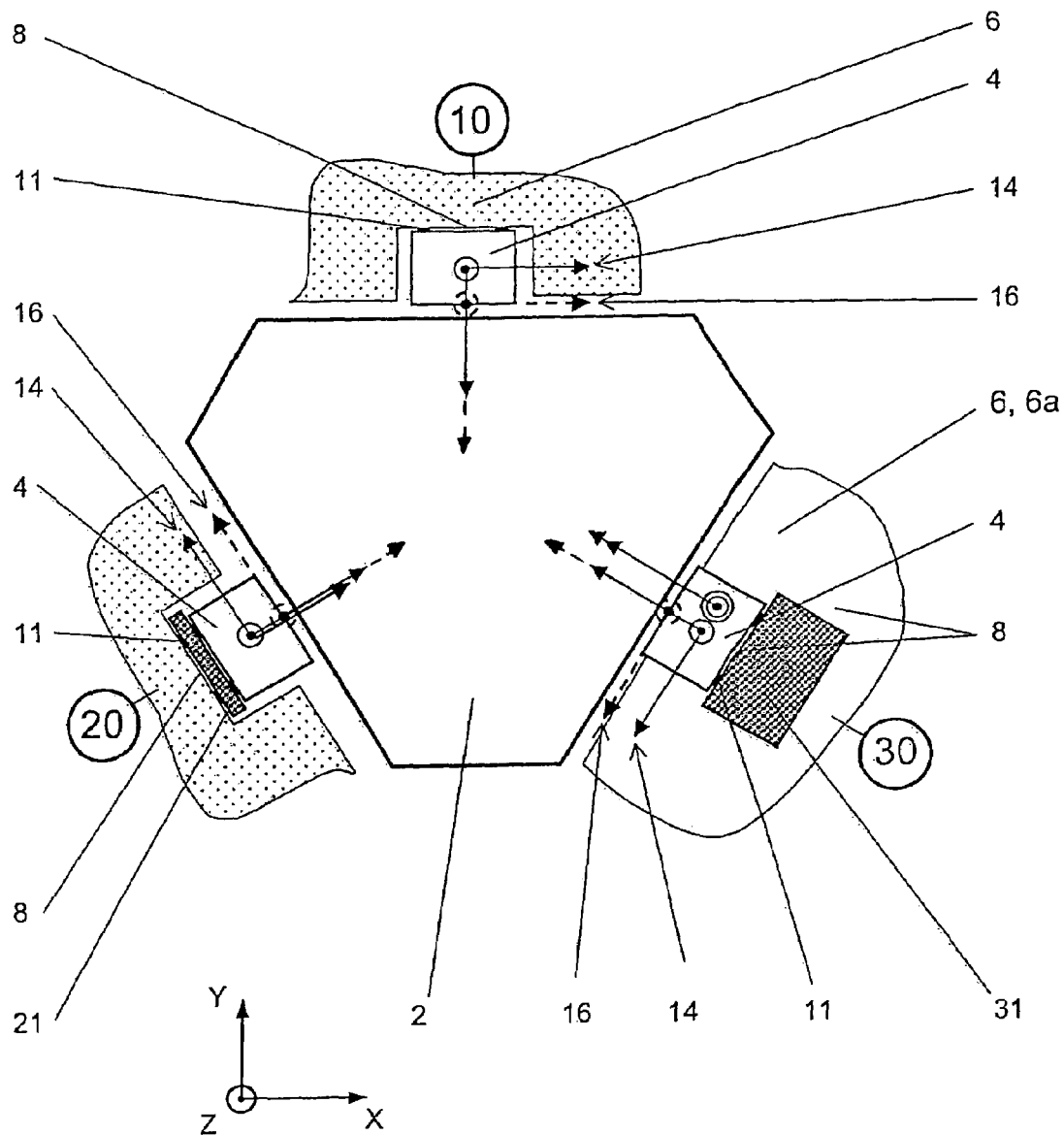
FIG. 2a depicts details of a projection optics assembly of the lithographic assembly according to embodiments of the invention.
Figure 2B:
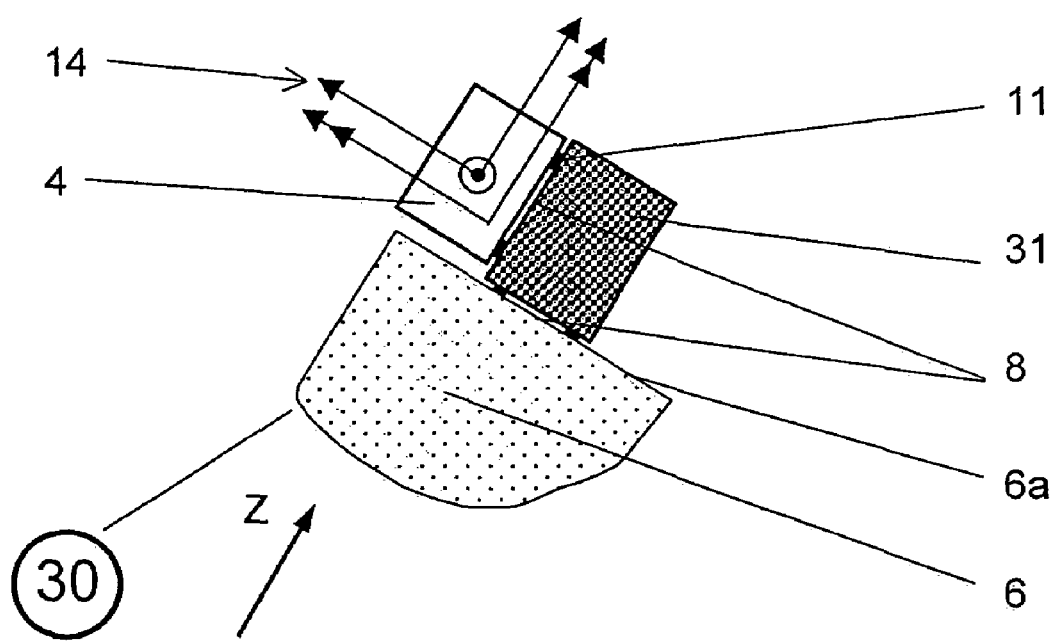

FIG. 2a depicts details of a projection optics assembly according to embodiments of the invention. FIG. 2b depicts details of one of the embodiments shown in FIG. 2a.

In the following description, the invention is described with reference to a sensor element that is positioned with respect to an optical element, such as a mirror, in a stable way, in the context of a projection optics assembly for use in a lithographic apparatus operating in the extreme ultraviolet wavelength range. However, the invention is not limited in this respect and has application in to other fields, where one element is to be fixedly mounted with respect to a second element.

A projection optics assembly typically includes six mirrors, of which one is shown in FIG. 2a. Of these six mirrors, five are adjustable by Lorenz actuation under position control. The one remaining mirror (not shown in FIG. 2a) is typically adjusted only once during assembly. The projection optics assembly generally includes, although the invention is not limited in this respect, five so-called mirror modules that provide a fully functional adjustable mirror. These five mirror modules are mounted into a support frame 6. The remaining sixth mirror is mounted onto the structure as well. In the following, the expression support frame 6 is intended to cover any support frame within the assembly, such as the reference frame, and any support frame included in the mirror modules. The invention has application to those situations where the optical elements 2 are mounted directly in the support frame 6, as well as in or on a support frame 6 in a mirror module.

A mirror module typically includes a mirror 2, actuator elements (not shown), such as Lorenz actuator units including a reaction mass and a magnetic gravity compensator, a support frame 6 (which may also be referred to in the art as a so-called "sensor frame"), and position sensors 4.

The support frame 6 supports the position sensors 4 and also part of the actuator units and the gravity compensator. The position sensors 4 are, preferably, extremely accurate two dimensional sensors. To position each mirror 2 accurately with six degrees of freedom, three such position sensors 4 are provided per mirror 2. Each position sensor 4 is provided with a reference part (not shown) which is attached to the mirror 2. In the embodiments shown, the position sensors 4 are adapted to sense the position of the mirror 2 in two directions. It is noted that the invention is not limited in respect of the particular type of sensor and has application to sensors having a variety of functionalities, for example, sensors that sense position in more or less directions than two, and other elements such as actuators.

For the particular embodiment where a sensor element 4 is to be positioned with respect to a mirror element 2, and fixed to a support frame 6, the present invention provides that the sensors 4 are positioned in a spaced relationship oriented relative to the mirrors in an adjustable manner. Preferably, the sensors 4 are fixed with respect to the support frame 6. It is desirable that the fixation is achieved so that the sensor attachment is as stiff as possible, and that after fixation, the sensors 4 are as stably positioned as possible.

In general, adjustment of one element relative to a second element involves six degrees of freedom. The location in the support frame 6 at which the first and second elements interface or interact with one another defines an interface surface 8 in or on the frame 6. The interface surface 8 allows for the displacements and rotations involved in positioning and orienting of two elements with respect to each other. Convention has been to design an interface surface including six spacers. As mentioned above, the problems with conventional design include poor stability performance, complex manufacturing procedure in terms of the number of parts, and the time for manufacture, which all contribute to a higher cost. These problems may be overcome by providing the interface surface 8 in or on the support frame 6, in accordance with the present invention.

With respect to the ease of fixation, according to an embodiment of the invention, this may be achieved by the provision of bolts.

With respect to the stable positioning of the sensor 4 with respect to the mirror 2 after fixation has occurred, in general, with respect to interfacing of a first element 4 with respect to a second element 2, and with regard to position stability, it is advantageous to have as few different parts as possible, and as few transitions between different parts as possible. The present invention provides stable positioning in both the short and long term, while using a minimum of spacers.

FIG. 2a shows three alternative embodiments 10, 20, 30 according to the present invention. In particular, FIG. 2a shows three possible sensor element mountings with associated adjustable degrees of freedom. A first element 4 having a predetermined functionality is fixedly positioned with respect to a second element 2. The elements 2, 4 are arranged in a spaced relationship on a support frame 6. The support frame 6 is provided with an interface surface 8 formed on or in the support frame 6 for receiving the first element 4. The interface surface 8 determines the position of the first element 4 with respect to the second element 2, and is adapted in accordance with the predetermined functionality so that the first element 4 is positionable with respect to the second element 2 with at least three degrees of freedom. In the particular embodiments shown, a sensor 4 is provided that measures in two directions 16 (as shown by the single headed dotted arrow lines 16 in FIG. 2a) the position of mirror 2. In order to adjust the zero pulse, the sensor 4 is positionable in these two measurement directions with respect to a mirror 2. The sensor adjustment directions are depicted by solid arrow lines 14. In addition, due to the working principle of the sensors shown in FIGS. 2a and 2b, rotation around the axis perpendicular to the two measurement directions 16 gives rise to a Moire pattern. In order to overcome this effect, adjustment around this axis perpendicular to the two measurement directions 16 is preferably provided.

In a first alternative configuration 10, a sensor 4 is mounted directly on the interface surface 8. The interface surface 8 is formed directly in the support frame 6. In one embodiment according to this configuration 10, the sensor 4, in use, is mounted substantially vertically on a substantially vertical interface surface 8, which may be formed by one or more planes or other surface or surfaces of the sensor support frame 6. Such a surface allows for adjustment in the three degrees of freedom described above, i.e. in the two measurement directions 16, and the direction of rotation 16 about the axis perpendicular to the two measurement directions 16. Such adjustment is provided without the need for any spacers. The sensor 4 is fixed onto the interface surface 8 by the provision of bolts, in particular long, slender bolts, which are provided so that in use, the sensor 4 is pulled against the interface plane 8. It has been found that this arrangement provides a highly stable sensor mount. It is particularly stable in comparison to conventional sensor mounting arrangements.

In a second embodiment 20, the sensor 4 is mounted such that in use, the interface surface 8 is arranged vertically, as is the case in the first configuration. In addition, a platelet 21 may be disposed between the interface surface 8 and the sensor 4. The provision of a platelet allows for adjustment in four degrees of freedom, because in addition to those directions mentioned above with reference to the first configuration, the platelet allows for adjustment of the distance between the sensor and the mirror. The sensor 4 is fixed onto the interface surface 8 with the platelet 21, which may include a spacer, and also by the provision of bolts. The platelet 21 may be included of an element made of materials such as ZERODUR® or other ultra low expansion (ULE) materials such as INVAR®, metals such as aluminium or iron, and ceramic materials. Preferably, the material of the platelet 21 has a similar thermal expansion coefficient as the material of the support frame 6. The dimensions of the platelet 21 are determined primarily by the adjustment required in terms of the distance between the sensor 4 and the mirror 2. It is seen that adjustment of three degrees of freedom by in-plane displacements and/or rotations is achieved. The fourth degree of freedom may be achieved by grinding of only the thickness of the interface element to the required value.

In a third embodiment 30, the sensor 4 is mounted onto an interface surface 8, and the interface surface 8 is disposed in a horizontal orientation in use. In particular, the interface surface 8 includes two surfaces oriented with respect to one another. In the third embodiment shown in FIGS. 2a and 2b, the interface surface 8 includes an upper or lower surface 6a of the support frame 6 and a surface of an interface element 31. The interface element 31 may include a block of material, preferably included of the same material as the support frame 6. The interface block 31 is disposed on a surface of the support frame 6, in use, preferably a horizontal surface. The third alternative configuration 30 allows for adjustment of the sensor 4 with respect to the mirror 2 in five degrees of freedom. Fixing the sensor 4 onto the interface block 31 may be achieved using three bolts, as is shown in more detail and described with reference to FIGS. 3a and 3b. For situations where adjustment in six degrees of freedom is needed, it is seen according to the embodiment shown according to the third alternative configuration that grinding at an angle of only one side of the interface block 31 may be needed. As with the first embodiment, the second and third embodiments have been found to provide a stable sensor mount in comparison to conventional mounting arrangements. FIG. 2b depicts details of one of the embodiments shown in FIG. 2a. In particular, FIG. 2b is provided to show further detail of the third embodiment 30. In particular, it shows a cross sectional view taken through the sensor 4, in which the interface element 31 lies in a plane perpendicular to that shown in FIG. 2a. Also shown in FIGS. 2a and 2b are interface pads 11 that are described hereinbelow in more detail. It is seen that adjustment of five degrees of freedom may be achieved by displacements and/or rotations in the two interface surfaces (frame-interface element and interface element-sensor). The sixth degree of freedom may be achieved by the grinding of only the one angle between the two interface surfaces of the interface element to the prescribed value.

Figure 3A:
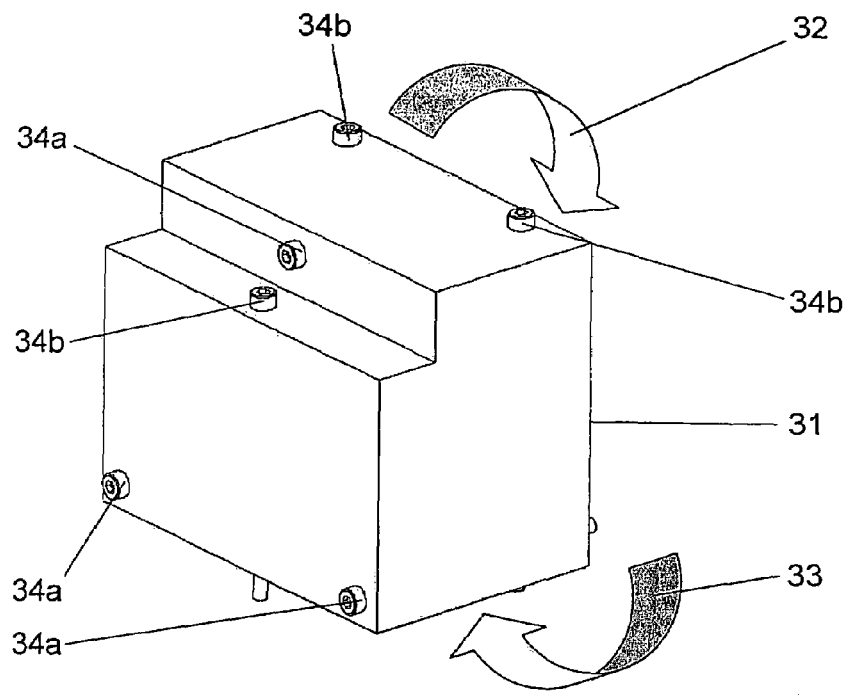
FIGS. 3a and 3b depict an interfacing element according to two further embodiments of the invention, respectively.
Figure 3B:
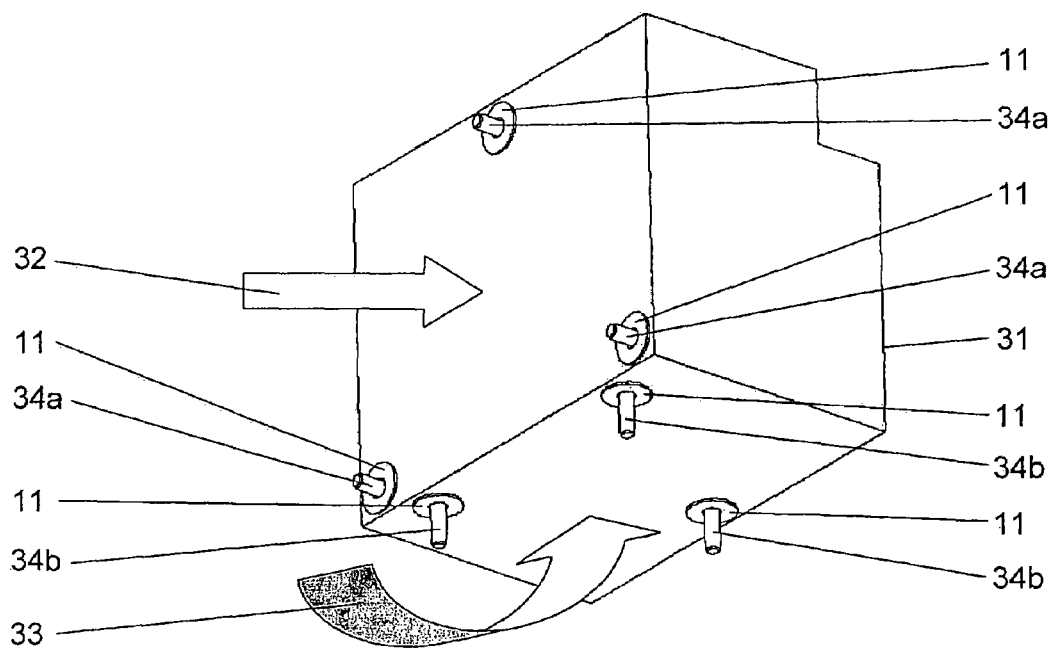

FIGS. 3a and 3b depict an interfacing element 31 for incorporation in the second and third embodiment 20, 30 of the present invention, respectively. In particular, FIGS. 3a and 3b show an interface block 31 and attachment elements 34, which typically include bolts that are arranged to attach the interface block 31 on a first sensor side 32 to the sensor 4 and on a second frame side 33 to the support frame 6. In the embodiment shown, six bolts are provided. Of these bolts, three bolts 34a are provided to attach the interface element 31 to the sensor 4 at a first interface surface 32 and a further three bolts 34b are provided to attach the interface element 31 to the support frame 6 at a second interface surface 33. The bolts function by pulling the interface element 31 onto interface surfaces 32 and 33, respectively. The material of the interface element 31 is preferably chosen so that its thermal expansion is the same or similar to that of the support frame 6. It may, for example, be made of materials similar to those described above with respect to the platelet 21 of the support frame 6. As mentioned, the third embodiment 30 attached as shown in FIGS. 2 and 3a and 3b is also very stable in comparison to conventional arrangements.

It will be understood that the embodiments 10, 20 and 30 shown in FIG. 2 may be used in an interchangeable manner with one another depending on the particular application.

In the foregoing, the particular example has been described of mounting a sensor with respect to a mirror. However, the present invention is not limited in this respect. In general, the present invention has application to situations where any element requires adjustment and subsequent fixing with respect to a second element. For example, another application in a lithographic apparatus is to adjust and mount an actuator unit with respect to the mirror. In such a situation, the actuation unit is preferably mounted in accordance with first or second embodiments 10, 20, but with the modification that, in use, instead of the vertical interface plane of the support frame 6 being used, a horizontal interface plane of the support frame 6 is used as an interface plane. In the second configuration, the single spacer would provide height adjustment, and is inserted between the underside of the actuator unit and the interface plane. If no height adjustment is necessary, the first embodiment 10 may be chosen and no spacers may be needed. It will be understood that depending upon the particular functionality of the element to be mounted, for example, the function of the unit in a broad sense, e.g., sensing, actuation, etc., but also the function of the unit in a more precise sense, e.g., the directions of sensing or the direction in which the actuation takes place, the mounting arrangement may be adapted. The present invention is in tended to cover any such alternative arrangements. It is understood that it is the functionality of the first element that determines a particular arrangement.

In FIGS. 2a and 2b, in the alternative embodiments, fixing may be achieved using bolts, as shown in FIGS. 3a and 3b, which clamp the sensor onto its interface surface 8. Although FIGS. 3a and 3b show the clamping of a sensor, as shown in alternative embodiment 30, the use of bolts to clamp the sensor to the interface surface may just as readily be applied to the other embodiments 10, 20. In FIGS. 3a and 3b, two sets of three long, slender bolts 34 are used. The first set 34a clamps the interface element 31 to the sensor. The second set 34b clamps the interface element 31 to the support frame 6. Also shown are interface pads 11, which may optionally be provided. Where interface pads 11 are used, the bolts 34 pass through the middle of the interface pads 11. In these particular embodiments, the interface pads 11 provide the interface surface. As mentioned, bolts may also be used as an attachment element 11 for those embodiments 10 where no interface element is needed.

As mentioned, the present invention concerns the mounting of an element, such as a sensor or actuator, on an interface surface. Fixation may be done in a variety of ways. Non-limiting examples include gluing or direct crystal bonding. Providing attachment elements, such as clamping elements, e.g. bolts, is one alternative. As described, clamping may be achieved by using long slender bolts that pass through holes formed in the interface areas of relevant elements. It has been found that this particular arrangement may provide a very stiff and stable positioning. Furthermore, it is a less expensive, straightforward, stable, and stiff manner of applying a clamping force. However, the invention is not limited in this respect, and other attachment or clamping elements may also be provided, e.g. by a spring construction. It has been found that independent of the particular attachment element used, the attachment element is designed to apply a clamping force through the relevant elements and interface surface. The attachment element is preferably designed to account for any internal deformations that may occur due to its use. It has been found, for example, that the bolts do not cause any significant internal deformation. Preferably, the clamping force is of a constant magnitude over time, and independent of any temperature changes.

As discussed above, the present invention may provide advantages, such as increased simplicity and stability, far less parts, less interfaces, relaxed tolerances, improved dynamic behavior, improved manufacturability, and improved testability. In addition, the present invention may provide improved long-term stability. While some of these advantages may also be attained, in part, with a support frame included of materials such as ZERODUR®, but also other ultra low expansion (ULE) materials, metal materials, such as INVAR®, aluminium or other ceramic materials, it is observed that the choice of material, and the particularities of the construction or the environment do not significantly effect the performance of the present invention. The advantages mentioned above are derived from the fact that interfacing is achieved in a stiff and robust manner. This is achieved with no, or at the most one, additional interface element. The interface surfaces are shaped so that the elements may be positioned accurately with respect to one another on their respect surfaces. The elements may be clamped together, for example, using bolts.

While specific embodiments of the invention have been described above, it will be appreciated that the invention may be practiced otherwise than as described. The description is not intended to limit the invention.

What is claimed is:

1. An assembly comprising:
    a first element comprising a sensor having a predetermined functionality that is positioned with respect to a second element, said elements being arranged in a spaced relationship on a support frame, said support frame having an interface surface formed on or in said support frame for receiving said first element, and
    an interfacing element disposed between said interface surface and said first element,
    wherein said interface surface determines the position of said first element with respect to said second element, and is configured in accordance with said predetermined functionality so that said first element is positionable with respect to said second element with at least three degrees of freedom.

2. An assembly according to claim 1, wherein said first element is mounted directly on said interface surface.

3. An assembly according to claim 1, wherein said interfacing element comprises a platelet.

4. An assembly according to claim 3, wherein said first element is positionable with respect to said second element with four degrees of freedom.

5. An assembly according to claim 1, wherein said interfacing element is disposed on said interface surface.

6. An assembly according to claim 1, wherein said interfacing element is adapted to be attached to said interface surface by an attachment element or elements, which are adapted to constrain movement of said interfacing element with respect to at least one of said degrees of freedom.

7. An assembly according to claim 6, wherein said interfacing element comprises a substantially block shaped component and said attachment element comprises a plurality of rods, wherein said rods are arranged to pass through said block and attach to said interface surface in a plurality of directions so as to constrain movement of said block in said degrees of freedom.

8. An assembly according to claim 1, wherein said sensor is configured to sense the position and/or orientation of said second element with respect to a reference surface located on or in said support frame, wherein said interface surface is disposed at said predetermined location, which is predetermined with respect to said reference surface.

9. An assembly according to claim 1, wherein said second element is a mirror.

10. An assembly according to claim 1, wherein said predetermined functionality comprises measuring a position and/or orientation of said second element.

11. An assembly according to claim 1, wherein the assembly is part of a projection optics assembly.

12. An assembly comprising:
a mirror;
a sensor unit constructed and arranged to sense a position and/or orientation of the mirror;
a support frame constructed and arranged to support the sensor unit, the support frame comprising an interface surface;
an interfacing element disposed between the interface surface and the sensor unit; and
an adjusting structure that is part of or engages the interface surface to adjust a position of the sensor unit based upon a known position of the interface surface and the mirror.

13. An assembly comprising:
a sensor unit;
an interfacing element; and
a mirror,
wherein the sensor unit is constructed and arranged to sense a position and/or orientation of the mirror,
wherein the sensor unit and mirror are disposed in spaced relationship on a support frame, the support frame having an interface surface,
wherein the interfacing element is disposed between the interface surface and the sensor unit, and
wherein the interface surface corresponds to the position of the sensor unit with respect to the mirror and is configured so that the sensor unit is positionable with respect to the mirror with at least three degrees of freedom.

* * * * *